United States Patent
Balasekaran et al.

(10) Patent No.: US 10,312,390 B2
(45) Date of Patent: Jun. 4, 2019

(54) LIGHT RECEIVING DEVICE AND METHOD OF PRODUCING LIGHT RECEIVING DEVICE

(71) Applicant: SUMITOMO ELECTRIC INDUSTRIES, LTD., Osaka (JP)

(72) Inventors: Sundararajan Balasekaran, Yokohama (JP); Daisuke Kimura, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/935,848

(22) Filed: Mar. 26, 2018

(65) Prior Publication Data

US 2018/0342635 A1 Nov. 29, 2018

(51) Int. Cl.
*H01L 31/0352* (2006.01)
*H01L 27/146* (2006.01)
*H01L 31/0304* (2006.01)
*H01L 31/18* (2006.01)
(Continued)

(52) U.S. Cl.
CPC ........... *H01L 31/035236* (2013.01); *H01L 27/14636* (2013.01); *H01L 27/14649* (2013.01); *H01L 27/14694* (2013.01); *H01L 31/022408* (2013.01); *H01L 31/0304* (2013.01); *H01L 31/035281* (2013.01); *H01L 31/109* (2013.01); *H01L 31/184* (2013.01); *H01L 31/1892* (2013.01); *H01L 31/03046* (2013.01); *H01L 31/1844* (2013.01)

(58) Field of Classification Search
CPC .................... H01L 27/14649; H01L 27/14694
See application file for complete search history.

(56) References Cited

U.S. PATENT DOCUMENTS

| 8,847,202 | B1 * | 9/2014 | Nosho | H01L 31/02016 257/15 |
| 2011/0037097 | A1 * | 2/2011 | Scott | B82Y 20/00 257/184 |

(Continued)

OTHER PUBLICATIONS

Gautam, Nutan et al., "Band engineered HOT midwave infrared detectors based on type-II InAs/GaSb strained layer superlattices", Elsevier, *Infrared Physics Technology* (2013).

*Primary Examiner* — Walter H Swanson
(74) *Attorney, Agent, or Firm* — Smith, Gambrell & Russell, LLP.

(57) ABSTRACT

A light receiving device includes a substrate having a principal surface and a back surface including a light receiving surface; a metal wire disposed on the principal surface, the metal wire including a bonding portion having an opening; and photodiodes that is arranged in an array on the substrate, each of the photodiodes including an electrode connected to the bonding portion of the metal wire and a semiconductor mesa including a stacked semiconductor layer, the stacked semiconductor layer including a first semiconductor layer disposed on the substrate, an optical absorption layer including a type-II superlattice structure, and a second semiconductor layer. Each of the electrodes of the photodiodes is disposed on a side surface of the semiconductor mesa in contact with the first semiconductor layer. The first semiconductor layer faces to the light receiving surface through the opening of the bonding portion.

3 Claims, 13 Drawing Sheets

(51) Int. Cl.
*H01L 31/109* (2006.01)
*H01L 31/0224* (2006.01)

(56) References Cited

U.S. PATENT DOCUMENTS

2012/0168720 A1* 7/2012 Akita ................ H01L 21/02392
257/21
2016/0276528 A1* 9/2016 Kizhaev .................. H01L 33/06

* cited by examiner

LIGHT RECEIVING DEVICE AND METHOD OF PRODUCING LIGHT RECEIVING DEVICE

BACKGROUND OF THE INVENTION

1. Field of the Invention

The present invention relates to a light receiving device and a method of producing a light receiving device.

2. Description of the Related Art

Non-Patent Literature 1 (Nutan Gautam et al., "Band engineered HOT midwave infrared detectors based on type-II InAs/GaSb strained layer superlattices", ELSEVIER, Infrared Physics & Technology (2013)) describes a technique related to a light receiving device having sensitivity to infrared light. This light receiving device has a type-II InAs/GaSb superlattice structure.

SUMMARY OF THE INVENTION

A photodiode having sensitivity to light in the infrared region includes an optical absorption layer that is made of a semiconductor containing antimony (Sb) as a constituent element. Specifically, the absorption layer of the photodiode includes a superlattice structure in which GaSb and InAs are alternately stacked on each other. In the photodiode including such an optical absorption layer, a superlattice structure may be used also in a contact layer.

In an image sensor, a plurality of photodiodes is arranged in an array. In a photodiode array of an image sensor and the like, a mesa structure is formed in order to separate photodiodes from one another. This mesa structure is formed by etching. In most cases, the etching is stopped in the middle of a lower contact layer including a superlattice structure, and the resulting lower contact layers of a plurality of photodiodes remain connected together. In this structure, a common electrode in contact with the lower contact layers is disposed on the plurality of photodiodes. To stop the etching at the lower contact layer, the lower contact layer is required to have a sufficient thickness. However, the thick lower contact layer increases the dark current of photodiodes. In addition, the thick lower contact layer impedes the rapid transfer of carriers. Thus, to achieve sufficient sensitivity, a high bias voltage is required.

A light receiving device according to one aspect of the present invention includes a substrate having a principal surface and a back surface opposite to the principal surface, the back surface including a light receiving surface; a metal wire disposed on the principal surface of the substrate, the metal wire including a bonding portion having an opening; and a plurality of photodiodes that is arranged in an array on the substrate, each of the photodiodes including an electrode connected to the bonding portion of the metal wire and a semiconductor mesa including a stacked semiconductor layer, the stacked semiconductor layer including a first semiconductor layer disposed on the substrate, an optical absorption layer disposed on the first semiconductor layer, and a second semiconductor layer disposed on the optical absorption layer, the first semiconductor layer including a first conductivity-type III-V group compound semiconductor, the optical absorption layer including a type-II superlattice structure, the second semiconductor layer including a second conductivity-type III-V group compound semiconductor. Each of the electrodes of the photodiodes is disposed on a side surface of the semiconductor mesa in contact with the first semiconductor layer. In addition, the first semiconductor layer faces to the light receiving surface of the substrate through the opening of the bonding portion.

A light receiving device according to other aspect of the present invention includes a substrate having a principal surface and a back surface opposite to the principal surface, the back surface including a light receiving surface; a metal wire disposed on the principal surface of the substrate, the metal wire including a bonding portion having an opening; and a plurality of photodiodes that is arranged in an array on the substrate, each of the photodiodes including an electrode connected to the bonding portion of the metal wire and a semiconductor mesa including a stacked semiconductor layer, the stacked semiconductor layer including a first semiconductor layer disposed on the substrate, an optical absorption layer disposed on the first semiconductor layer, and a second semiconductor layer disposed on the optical absorption layer, the first semiconductor layer including a first conductivity-type III-V group compound semiconductor, the optical absorption layer including a type-II superlattice structure, the second semiconductor layer including a second conductivity-type III-V group compound semiconductor. Each of the electrodes of the photodiodes is disposed on a surface of the first semiconductor layer that faces to the light receiving surface of the substrate through the opening of the bonding portion. The electrode is in contact with the first semiconductor layer at the surface of the first semiconductor layer. The electrode has an opening. In addition, the surface of the first semiconductor layer is exposed through the opening of the electrode.

A method for producing a light receiving device according to other aspect of the present invention includes the steps of growing a first semiconductor layer, an optical absorption layer, and a second semiconductor layer in this order on a III-V group compound semiconductor region, the first semiconductor layer having a type-II superlattice structure including a first conductivity-type III-V group compound semiconductor, the optical absorption layer including a type-II superlattice structure, the second semiconductor layer including a second conductivity-type III-V group compound semiconductor; bonding a temporary substrate onto the second semiconductor layer; removing the III-V group compound semiconductor region so as to expose the first semiconductor layer; forming a plurality of first electrodes in contact with the first semiconductor layer; fixing a substrate that includes a metal wire including a plurality of bonding portions to the plurality of first electrodes through the bonding portions; forming a plurality of semiconductor mesas by etching the second semiconductor layer, the optical absorption layer, and the first semiconductor layer after removing the temporary substrate; and forming a plurality of second electrodes on top surfaces of the semiconductor mesas, each of the second electrodes being in contact with the second semiconductor layer of the corresponding semiconductor mesa.

The above and other objects, features, and advantages of the present invention will be readily apparent from the following detailed description of the preferred embodiments of the invention with reference to the accompanying drawings.

DESCRIPTION OF THE PREFERRED EMBODIMENTS

Figure 1:
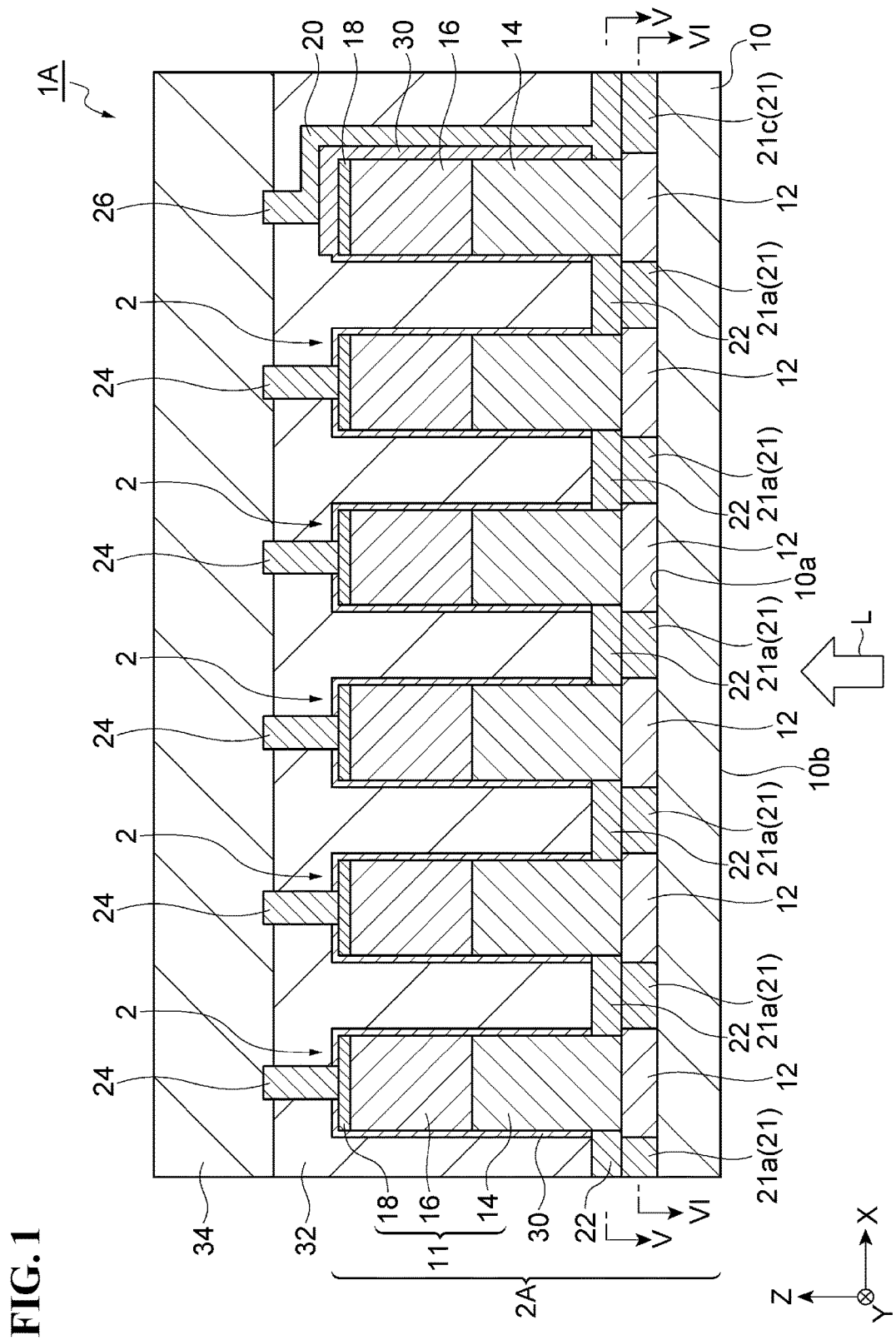
FIG. 1 is a sectional view showing a structure of an infrared light receiving apparatus including a light receiving device according to an embodiment.

Subsequently, specific embodiments will be described below.

Description of Embodiments of Invention

A light receiving device according to an embodiment includes (a) a substrate having a principal surface and a back surface opposite to the principal surface, the back surface including a light receiving surface; (b) a metal wire disposed on the principal surface of the substrate, the metal wire including a bonding portion having an opening; and (c) a plurality of photodiodes that is arranged in an array on the substrate, each of the photodiodes including an electrode connected to the bonding portion of the metal wire and a semiconductor mesa including a stacked semiconductor layer, the stacked semiconductor layer including a first semiconductor layer disposed on the substrate, an optical absorption layer disposed on the first semiconductor layer, and a second semiconductor layer disposed on the optical absorption layer, the first semiconductor layer including a first conductivity-type III-V group compound semiconductor, the optical absorption layer including a type-II superlattice structure, the second semiconductor layer including a second conductivity-type III-V group compound semiconductor. Each of the electrodes of the photodiodes is disposed on a side surface of the semiconductor mesa in contact with the first semiconductor layer. In addition, the first semiconductor layer faces to the light receiving surface of the substrate through the opening of the bonding portion.

According to the light receiving device, the stacked semiconductor layers are included in the semiconductor mesas, and the semiconductor mesas are separated from one another. The stacked semiconductor layer of each semiconductor mesa includes the first semiconductor layer. The first semiconductor layer is a lower contact layer. The first semiconductor layer includes a first conductivity-type III-V group compound semiconductor. In this light receiving device, each photodiode includes an electrode in contact with the first semiconductor layer in the semiconductor mesa. In other words, the light receiving device does not include the first semiconductor layer common to the plural photodiodes. In the conventional light receiving device having a first semiconductor layer common to a plural photodiodes, the first semiconductor layer has a relatively large thickness to connect the plural photodiodes. In the light receiving device without the common first semiconductor layer, the first semiconductor layer, which is the lower contact layer, may have a small thickness. Consequently, the dark current of the photodiodes can be reduced. In addition, the rapid transfer of carriers is not impeded, and thus sufficient photosensitivity can be achieved even at a low bias voltage. In addition, in the light receiving device, each of the electrodes of the photodiodes is disposed on a side surface of the semiconductor mesa in contact with the first semiconductor layer. In this configuration, at least part of the plane of light incidence of the stacked semiconductor layer is uncovered by the electrode. Thus, contact between the electrode and the first semiconductor layer may be achieved without blocking the entry of light into the stacked semiconductor layer. In addition, this light receiving device includes the substrate connected to the plurality of electrodes. Specifically, the metal wire including the bonding portion is disposed on the principal surface of the substrate. The substrate is connected to the electrodes of the light receiving device through the bonding portion of the metal wire.

In the light receiving device according to an embodiment, the first semiconductor layer may include a type-II superlattice structure. The type-II superlattice structure of the first semiconductor layer may include a first layer containing As and a second layer containing Sb. In addition, the substrate may be a semiconductor substrate that is substantially transparent to an infrared light.

According to the light receiving device, the substrate is a semiconductor substrate that transmits infrared light. This enables the substrate to support the plurality of photodiodes without blocking the entry of infrared light into the stacked semiconductor layer. In this case, the substrate may be a Si substrate or an InP substrate having good infrared transmissivity.

The light receiving device according to an embodiment may further include a filler provided in the opening of the bonding portion. With this configuration, the reflection of infrared light on the back surface of the first semiconductor layer may be reduced. In addition, the plurality of photodiodes may be more firmly supported.

In the light receiving device according to an embodiment, the first semiconductor layer may have a thickness of 300 nm or more and 500 nm or less.

A light receiving device according to an embodiment includes (a) a substrate having a principal surface and a back surface opposite to the principal surface, the back surface including a light receiving surface; (b) a metal wire disposed on the principal surface of the substrate, the metal wire including a bonding portion having an opening; and (c) a plurality of photodiodes that is arranged in an array on the substrate, each of the photodiodes including an electrode connected to the bonding portion of the metal wire and a semiconductor mesa including a stacked semiconductor layer, the stacked semiconductor layer including a first semiconductor layer disposed on the substrate, an optical absorption layer disposed on the first semiconductor layer, and a second semiconductor layer disposed on the optical absorption layer, the first semiconductor layer including a first conductivity-type III-V group compound semiconductor, the optical absorption layer including a type-II superlattice structure, the second semiconductor layer including a second conductivity-type III-V group compound semiconductor. Each of the electrodes of the photodiodes is disposed on a surface of the first semiconductor layer that faces to the light receiving surface of the substrate through the opening of the bonding portion. The electrode is in contact with the first semiconductor layer at the surface of the first semiconductor layer. The electrode has an opening. In addition, the surface of the first semiconductor layer is exposed through the opening of the electrode.

In the light receiving device, light may enter through the rest of the surface of the first semiconductor layer (i.e., the plane of light incidence) in contact with the electrode. Therefore, the entry of infrared light into the stacked semiconductor layer can be ensured.

In the light receiving device according to an embodiment, the electrodes of the photodiodes may be disposed on an outer peripheral part of the surface of the first semiconductor layer. The electrodes of the photodiodes may have a frame-like planar shape or a doughnut-like planar shape. In this case, the planer shape of the electrode provides sufficient contact between the electrode and the first semiconductor layer while ensuring the entry of infrared light into the stacked semiconductor layer.

A method for producing a light receiving device according to an embodiment includes the steps of (a) growing a first semiconductor layer, an optical absorption layer, and a second semiconductor layer in this order on a III-V group compound semiconductor region, the first semiconductor layer having a type-II superlattice structure including a first conductivity-type III-V group compound semiconductor, the optical absorption layer including a type-II superlattice structure, the second semiconductor layer including a second conductivity-type III-V group compound semiconductor; (b) bonding a temporary substrate onto the second semiconductor layer; (c) removing the III-V group compound semiconductor region so as to expose the first semiconductor layer; (d) forming a plurality of first electrodes in contact with the first semiconductor layer; (e) fixing a substrate that includes a metal wire including a plurality of bonding portions to the plurality of first electrodes through the bonding portions; (f) forming a plurality of semiconductor mesas by etching the second semiconductor layer, the optical absorption layer, and the first semiconductor layer after removing the temporary substrate; and (g) forming a plurality of second electrodes on top surfaces of the semiconductor mesas, each of the second electrodes being in contact with the second semiconductor layer of the corresponding semiconductor mesa.

Details of Embodiments of Invention

Specific examples of the light receiving device and the method for producing a light receiving device according to the embodiments of the present invention will now be described with reference to the drawings. It should be understood, however, that the present invention is not limited to these examples; rather, the present invention is defined by the claims, and all changes which come within the meaning and range of equivalency of the claims are intended to be embraced therein. In the following description of the drawings, like numbers refer to like elements, and repetitive descriptions will be omitted.

FIG. 1 is a sectional view showing a structure of an infrared light receiving apparatus including the light receiving device according to the present embodiment.

Figure 2:
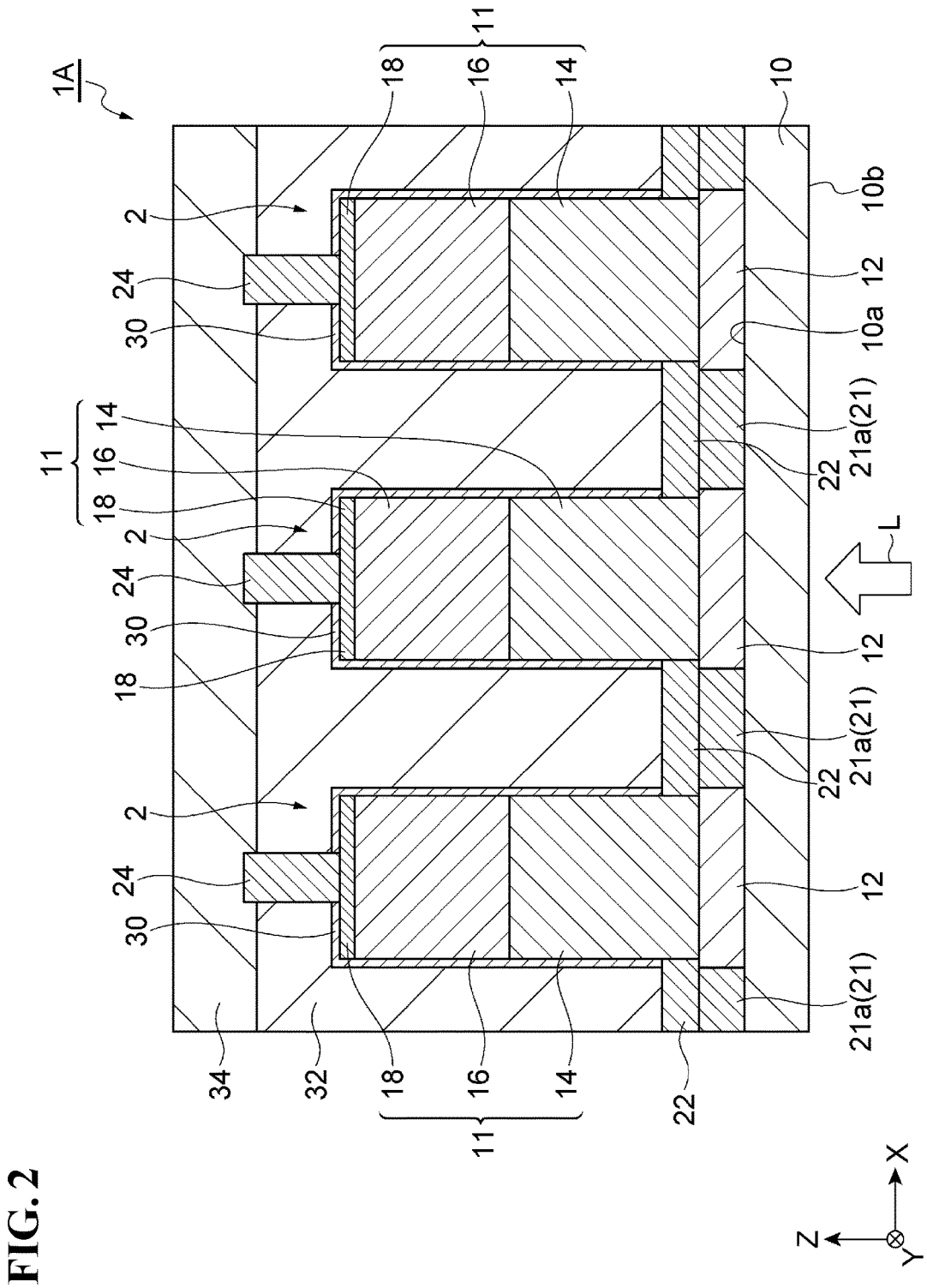
FIG. 2 is a partly enlarged sectional view of FIG. 1.

FIG. 2 is a partly enlarged sectional view of FIG. 1. In FIGS. 1 and 2, a Cartesian coordinate system including an X-axis, a Y-axis, and a Z-axis perpendicular to one another is shown. An infrared light receiving apparatus 1A shown in FIGS. 1 and 2 includes a light receiving device 2A and a silicon integrated device 34. The light receiving device 2A includes a substrate 10 and a plurality of photodiodes 2. The photodiodes 2 are arranged in an array on a principal surface of the substrate 10 and each of the photodiodes 2 has a mesa shape. The photodiodes 2 extend in a first axis (Z-axis) direction. The photodiodes 2 are disposed so as to form a two-dimensional array or a one-dimensional array. In this example, the photodiodes 2 are arranged so as to form a two-dimensional array aligned along a second axis (X-axis) direction and a third axis (Y-axis) direction that are parallel to the principal surface of the substrate 10 and are perpendicular to each other. For example, when the infrared light receiving apparatus 1A is of QVGA type, the number of the photodiodes 2 in the second axis direction is 320. The number of the photodiodes 2 in the third axis direction is 256. The pitch between the adjacent photodiodes 2 is, for example, 30 μm. The length of a side of each of the photodiodes 2 is, for example, 24 μm. When the infrared light receiving apparatus 1A is of VGA type, the number of the photodiodes 2 in the second axis direction is 620. The number of the photodiodes 2 in the third axis direction is 512. The pitch between the adjacent photodiodes 2 is, for example, 15 μm. The length of a side of each of the photodiodes 2 is, for example, 13 μm.

The silicon integrated device 34 includes a processing circuit that processes signals receiving from the light receiving device 2A. This processing circuit includes a plurality of processing circuit units each corresponding to each of the plurality of photodiodes 2. The processing circuit units are also disposed in an array in line with the array of the photodiodes 2. Each processing circuit unit is connected to an anode electrode 24 of the corresponding photodiode 2 and processes signals from the photodiode 2. Specifically, each processing circuit unit receives a photocurrent from the photodiode 2 and, for example, converts the current signal into a voltage signal while amplifying the signal. The silicon integrated device 34 is manufactured by using a technique for manufacturing a silicon integrated circuit.

The light receiving device 2A includes the substrate 10 and the plurality of photodiodes 2 disposed on the substrate 10. The substrate 10 supports the plurality of photodiodes 2. The photodiodes 2 each include a semiconductor mesa and are separated from one another. Each of the semiconductor mesas includes a stacked semiconductor layer 11. The stacked semiconductor layer 11 includes an n-type (first conductivity-type) contact layer 14, an optical absorption layer 16 sensitive to infrared light, and a p-type (second conductivity-type) contact layer 18 that are stacked in the first axis direction (Z-axis direction) on a principal surface 10a of the substrate 10. The n-type contact layer 14 is disposed on the substrate 10. The optical absorption layer 16 is disposed on the n-type contact layer 14. The p-type contact layer 18 is disposed on the optical absorption layer 16. Each of the semiconductor mesas including the stacked semiconductor layers 11 is covered with a passivation film 30 such as a silicon-based inorganic insulating film (e.g., $SiO_2$). The gap between the semiconductor mesas is filled with a resin (underfill) 32.

The n-type contact layer 14 is a first semiconductor layer in the present embodiment. The n-type contact layer 14 has a type-II superlattice structure including an n-type III-V group compound semiconductor. The p-type contact layer 18 is a second semiconductor layer in the present embodiment. The p-type contact layer 18 has a type-II superlattice structure including a p-type III-V group compound semiconductor.

The optical absorption layer 16 is disposed between the n-type contact layer 14 and the p-type contact layer 18. The optical absorption layer 16 includes a III-V group compound semiconductor layer and is sensitive to infrared light (particularly, mid-infrared light). The optical absorption layer 16 has sensitivity to light in the infrared region, for example, at a wavelength of 6 μm to 15 μm. The optical absorption layer 16 in the present embodiment has a type-II superlattice structure including a III-V group compound semiconductor.

The III-V group compound semiconductors constituting the n-type contact layer 14, the optical absorption layer 16, and the p-type contact layer 18 will now be described. These III-V group compound semiconductors may each include at least one semiconductor selected from the group consisting of binary mixed crystals such as InAs, GaSb, InSb, GaSb, and AlSb and ternary mixed crystals such as GaInAs and InAsSb. In each type-II superlattice structure, structural units each including a first layer containing As (e.g., InAs) and a second layer containing Sb (e.g., GaSb or InSb) are periodically stacked on one another. The second layer is made of a III-V group compound semiconductor different from that of the first layer. When the first layer is made of InAs, the second layer may be made of InGaSb. When the second layer is made of GaSb, the first layer may be made of InAsSb. Alternatively, the first layer may be made of InAsSb, and the second layer may be made of InGaSb. The structural unit may further include one or more III-V group compound semiconductor layers having compositions different from those of the first layer and the second layer (e.g., any of the binary mixed crystals and the ternary mixed crystals described above). As a p-type dopant, Be is used, for example. As an n-type dopant, Si is used, for example.

Figure 3:
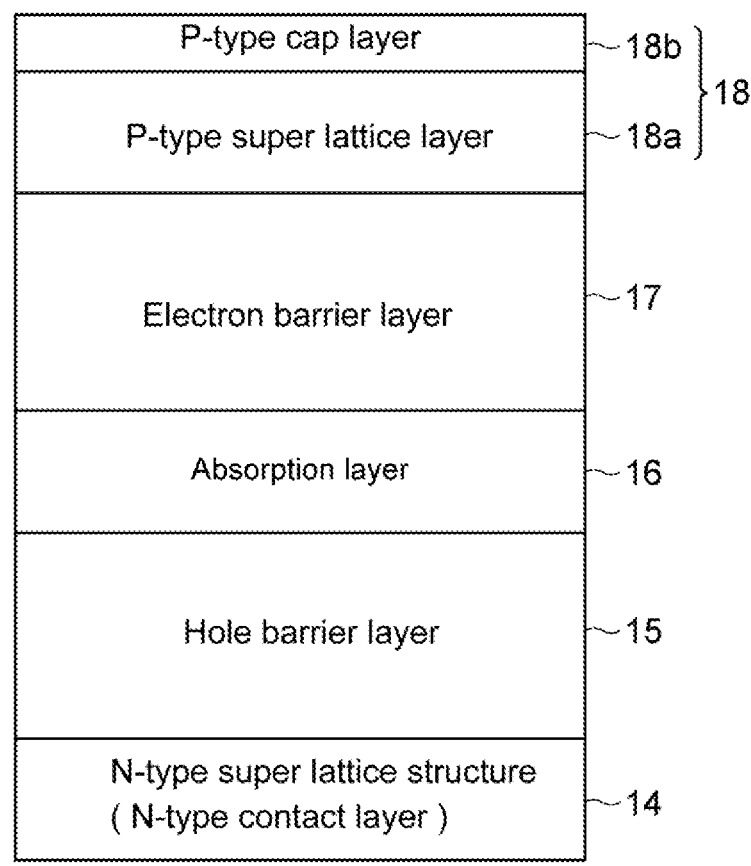
FIG. 3 is a schematic of a specific example of a configuration of a stacked semiconductor layer.

FIG. 3 is a schematic of a specific example of a configuration of the stacked semiconductor layer 11. As shown in FIG. 3, the n-type contact layer 14, for example, has a superlattice structure in which a GaSb layer, an InAs layer, and an InSb layer are stacked on one another for 50 periods. The n-type contact layer 14 is doped with Si. The dopant concentration of the n-type contact layer 14 is, for example, $1\times10^{17}$ cm$^{-3}$ to $3\times10^{17}$ cm$^{-3}$. The thickness of the n-type contact layer 14 is, for example, 300 nm to 500 nm.

The optical absorption layer 16, for example, has a superlattice structure in which a GaSb layer, an InAs layer, and an InSb layer are stacked on one another for 200 periods. The superlattice structure of the optical absorption layer 16 is doped with Be. The dopant concentration of the optical absorption layer 16 is, for example, $1\times10^{15}$ cm$^{-3}$ to $3\times10^{16}$ cm$^{-3}$. The thickness of the optical absorption layer 16 is, for example, 1.0 μm to 2.0 μm.

The p-type contact layer 18 includes a p-type superlattice layer 18a and a p-type cap layer 18b. The p-type superlattice layer 18a, for example, has a superlattice structure in which a GaSb layer, an InAs layer, and an InSb layer are stacked on one another for 50 periods. The superlattice structure of the p-type superlattice layer 18a is doped with Be, for example. The dopant concentration of the p-type superlattice layer 18a is, for example, $1\times10^{17}$ cm$^{-3}$ to $3\times10^{17}$ cm$^{-3}$. The thickness of the p-type superlattice layer 18a is, for example, 25 nm to 50 nm. The p-type cap layer 18b is disposed on the p-type superlattice layer 18a and, is made of, for example, a p-type InAs layer. The dopant concentration of the p-type cap layer 18b is, for example, $1\times10^{18}$ cm$^{-3}$ to $3\times10^{18}$ cm$^{-3}$. The thickness of the p-type cap layer 18b is, for example, 200 nm to 300 nm.

As shown in FIG. 3, a hole barrier layer 15 may be disposed between the n-type contact layer 14 and the optical absorption layer 16. The hole barrier layer 15, for example, has a superlattice structure in which a GaSb layer, an InAs layer, a GaSb layer, an InAs layer, and an InSb layer are stacked on one another for 16 periods. The superlattice structure of the hole barrier layer 15 is doped with Si. The dopant concentration of the hole barrier layer 15 is, for example, $1\times10^{16}$ cm$^{-3}$ to $3\times10^{16}$ cm$^{-3}$. The thickness of the hole barrier layer 15 is, for example, 150 nm to 300 nm.

An electron barrier layer 17 may be disposed between the optical absorption layer 16 and the p-type contact layer 18. The electron barrier layer 17, for example, has an undoped superlattice structure in which a GaSb layer, an AlSb layer, a GaSb layer, an InAs layer, and an InSb layer are stacked on one another for 50 periods. The thickness of the electron barrier layer 17 is, for example, 350 nm to 500 nm.

Each of the photodiodes 2 further includes a cathode electrode 22 (first electrode) in contact with the n-type contact layer 14 and an anode electrode 24 (second electrode) in contact with the p-type contact layer 18. In other words, the light receiving device 2A of the present embodiment does not include a cathode electrode common to the plurality of photodiodes 2 but includes the cathode electrodes 22 separately corresponding to each of the photodiodes 2. It should be noted that "separately" here does not mean that the contact of the cathode electrode 22 of each of the photodiodes 2 with the n-type contact layer 14 of the adjacent photodiode 2 is prevented. In each of the photodiodes 2, the cathode electrode 22 is in contact with a side surface of the n-type contact layer 14 that is not covered with the passivation film 30. The cathode electrode 22 is made of, for example, Al. The contact length between the cathode electrode 22 and the n-type contact layer 14 in a stacking direction (i.e., the first axis direction) of the stacked semiconductor layer 11 is, for example, 0.1 μm or more and 0.2 μm or less. In each of the photodiodes 2, the anode electrode 24 is in contact with a top surface (a surface opposite to the optical absorption layer 16) of the p-type contact layer 18 through an opening formed in the passivation film 30. The anode electrode 24 is made of, for example, Ti/Pt/Au.

The substrate 10 has the principal surface 10a and a back surface 10b opposite to the principal surface 10a. The substrate 10 is connected to the plurality of cathode electrodes 22 and retains the mechanical strength of the light receiving device 2A. Preferably, the substrate 10 is made of a material that transmits infrared light well. For example, the substrate 10 is made of Si or InP. In the present embodiment, the substrate 10 has a metal wire 21 formed on the principal surface 10a of the substrate 10. The metal wire 21 is made of, for example, a Au film.

Figure 4:
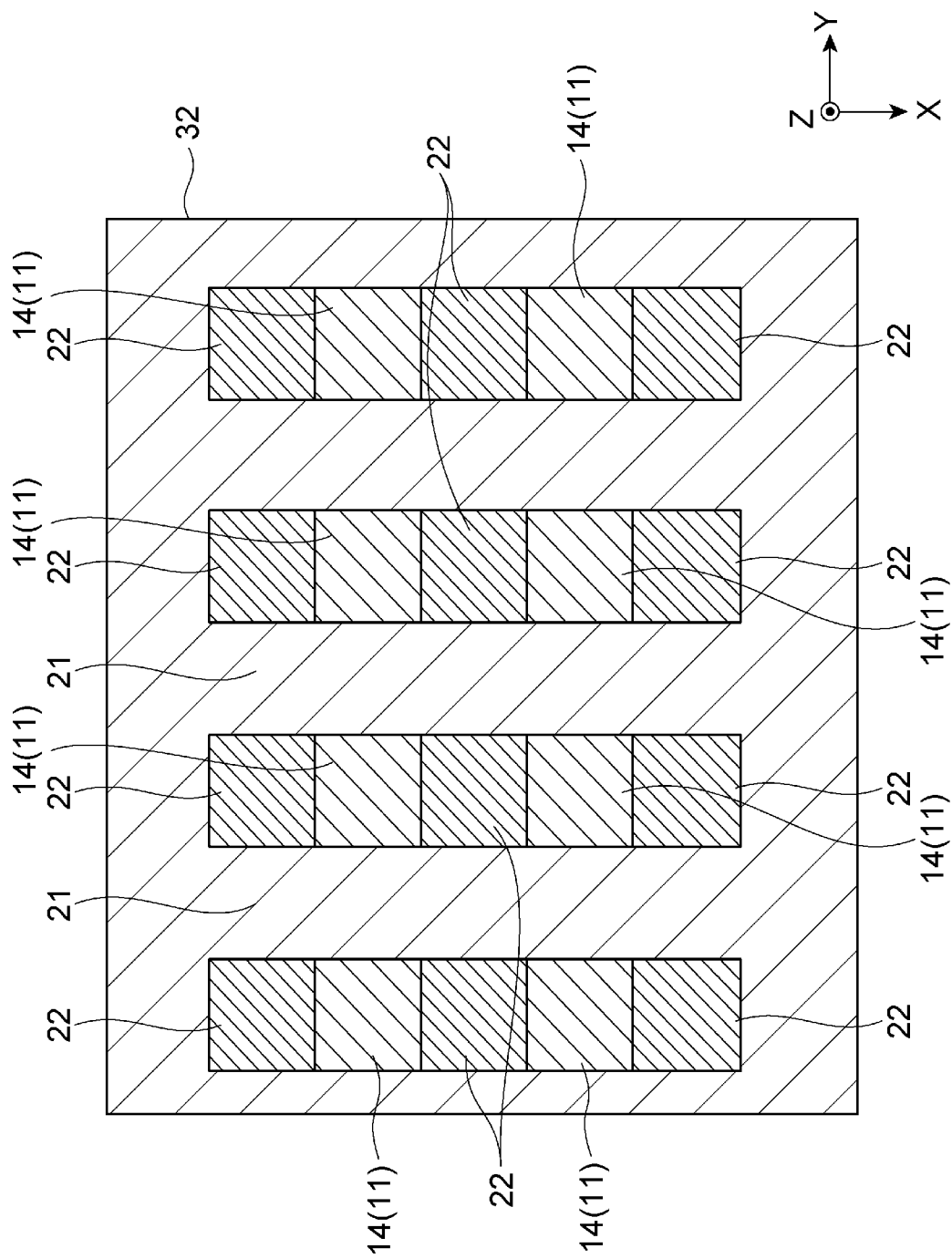
FIG. 4 is a sectional view taken along line V-V of FIG. 1 and shows the planar shape and arrangement of a plurality of cathode electrodes.
Figure 5:
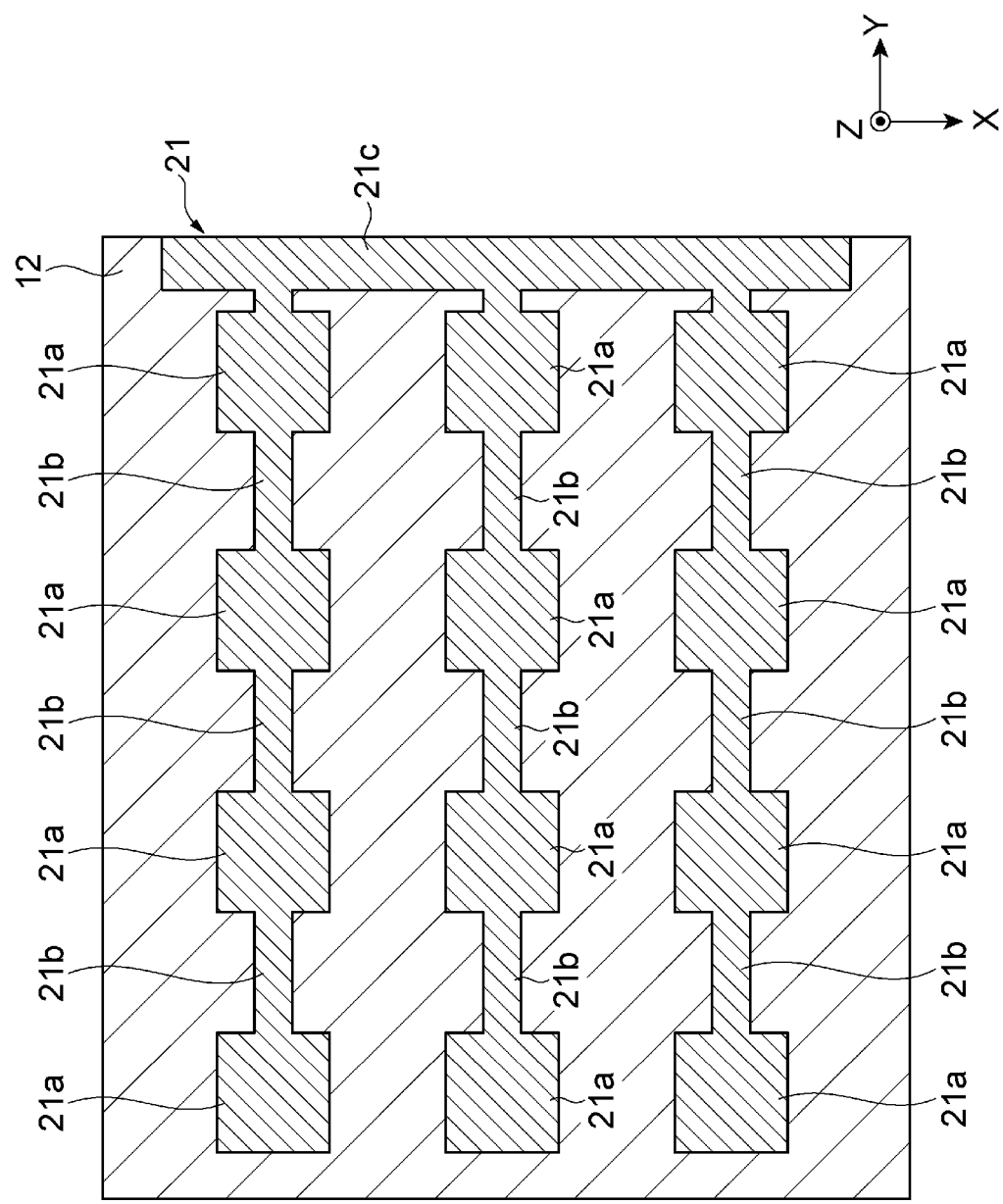
FIG. 5 is a sectional view taken along line VI-VI of FIG. 1 and shows the planar shape of a metal wire.

The planar shape of the plurality of cathode electrodes 22 and the metal wire 21 will now be described. FIG. 4 is a sectional view taken along line V-V of FIG. 1 and shows the planar shape and arrangement of the plurality of cathode electrodes 22. FIG. 5 is a sectional view taken along line VI-VI of FIG. 1 and shows the planar shape of the metal wire 21.

As shown in FIG. 4, the cathode electrodes 22 each have a rectangular planar shape and are two-dimensionally aligned along the second axis direction and the third axis direction. Each of the cathode electrodes 22 is flanked by the stacked semiconductor layers 11 (the n-type contact layers 14) in the semiconductor mesas aligned in the second axis direction. The stacked semiconductor layer 11 (the n-type contact layer 14) and the cathode electrode 22 are alternately disposed in the second axis direction. The gap between the cathode electrodes 22 aligned in the third axis direction and the gap between the stacked semiconductor layers 11 (the n-type contact layers 14) aligned in the third axis direction are filled with the underfill 32.

As shown in FIG. 5, the metal wire 21 is constituted by a plurality of bonding portions 21a, a plurality of wiring portions 21b, and a wiring portion 21c. The bonding portions 21a are two-dimensionally aligned along the second axis direction and the third axis direction and disposed immediately below each of the plurality of cathode electrodes 22. Openings are disposed between the plurality of bonding portions 21a. In the present embodiment, the wiring portions 21b are disposed across the openings disposed between the bonding portions 21a. Through the openings between the bonding portions 21a, light enters the n-type contact layers 14 of the photodiodes 2 from the back surface 10b (light receiving surface) of the substrate 10. Each of the bonding portions 21a is conductively bonded to the cathode electrode 22 of each of the photodiodes 2, for example, by flip-chip bonding. The wiring portions 21b are disposed between the bonding portions 21a aligned in the third axis direction and connects together the adjacent bonding portions 21a. The wiring portion 21c is disposed at one end in the third axis direction on the principal surface 10a of the substrate 10 and extends in the second axis direction. The wiring portion 21c connects together rows of the bonding portions 21a along the third axis direction. As shown in FIG. 1, the wiring portion 21c is electrically connected to an electrode 26 via a wire 20. The wire 20 is disposed along a side surface of the semiconductor mesa disposed on an end of the substrate. The electrode 26 is disposed on a top surface of the semiconductor mesa disposed on the end of the substrate. The electrode 26 is connected to the processing circuit of the silicon integrated device 34.

As shown in FIG. 5, a region excluding the metal wire 21 on the principal surface 10a of the substrate 10 is filled with a filler 12 having a high infrared light transmittance. Therefore, as shown in FIGS. 1 and 2, the gap between the substrate 10 and the n-type contact layer 14 of the stacked semiconductor layer 11 is filled with the filler 12. The filler 12 is made of, for example, a resin (underfill), a silicon-based inorganic insulating film such as a silicon oxide film, a silicon nitride film, and a silicon oxynitride film, or an antireflection coating film. The filler 12 does not need to be disposed, and the gap between the substrate 10 and the n-type contact layer 14 may be a void (air gap).

Figure 6:
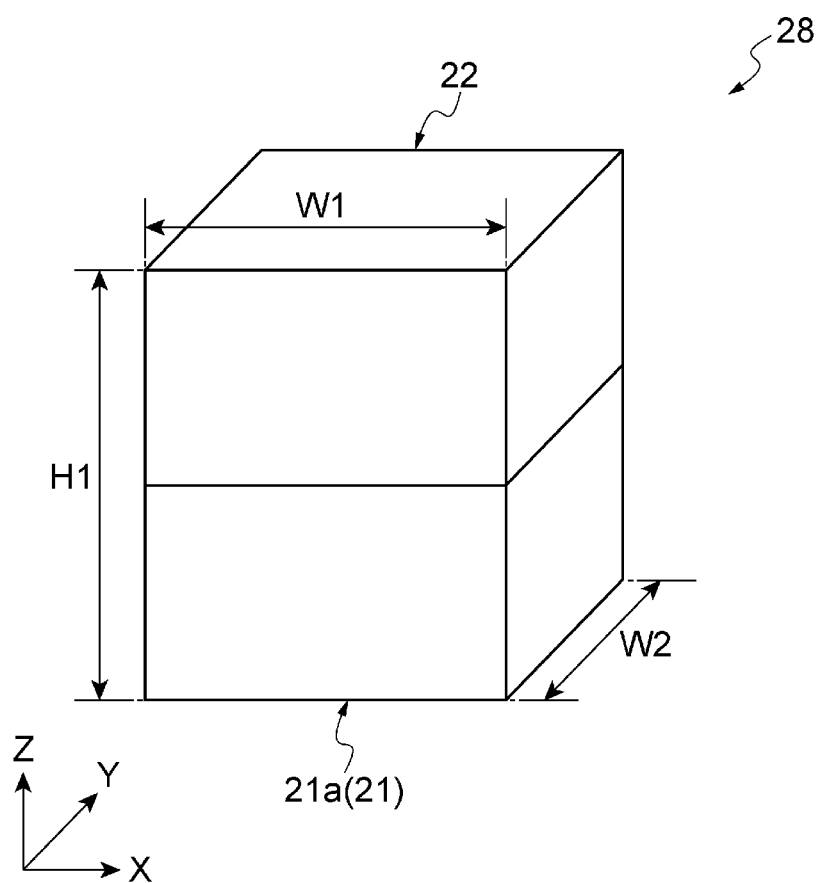
FIG. 6 is a perspective view of a metal body including one bonding portion and one cathode electrode.

FIG. 6 is a perspective view of a metal body 28 including a single bonding portion 21a and a single cathode electrode 22. As shown in FIG. 6, the metal body 28 has a rectangular parallelepipedal external shape. A width W1 in the second axis direction of the metal body 28 is, for example, 2 μm to 6 μm, a width W2 in the third axis direction is, for example, 13 μm to 24 μm, and a height H1 in the first axis direction is, for example, 0.5 μm to 1.0 μm. The height of the bonding portion 21a may optionally be increased or decreased by adjusting the thickness of the n-type contact layer 14.

The infrared light receiving apparatus 1A has a backside incident type structure. In the present embodiment, the back surface 10b of the substrate 10 includes a light receiving surface. Infrared light L, as shown in FIG. 1, that has entered from the back surface 10b side of the substrate 10 passes through the substrate 10 and the filler 12 and then enters the stacked semiconductor layer 11 through the back surface of the n-type contact layer 14. The infrared light L is then photoelectrically converted to carriers (electron and hole) in the optical absorption layer 16. One carrier (electron) generated in the optical absorption layer 16 transfers through the n-type contact layer 14 to the cathode electrode 22 and passes through the metal wire 21, the wire 20, and the electrode 26 to reach the processing circuit of the silicon integrated device 34. The other carrier (hole) generated in the optical absorption layer 16 transfers through the p-type contact layer 18 to the anode electrode 24 and reaches the processing circuit of the silicon integrated device 34.

Figure 7A:
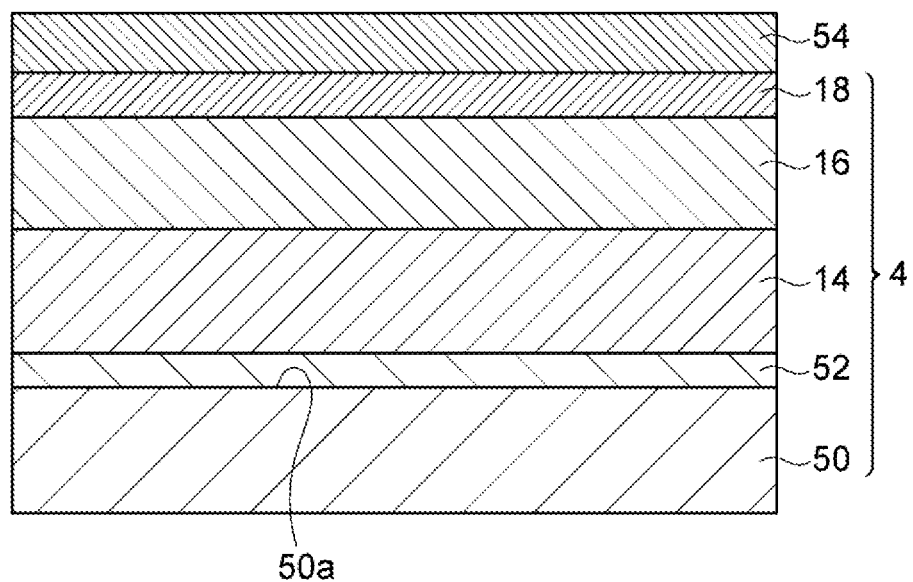
FIGS. 7A and 7B show steps in a production method of an embodiment.

A method for producing the light receiving device 2A of the present embodiment having the above-described configuration will be described. FIGS. 7A, 7B, 8A, 8B, 9A, 9B, 10A, and 10B show steps of the production method of the present embodiment. First, as shown in FIG. 7A, a substrate 50 having a principal surface 50a is provided. The substrate 50 is made of a III-V group compound semiconductor. In the embodiment, the substrate 50 is, for example, a GaSb substrate. A buffer layer 52 is epitaxially grown on the principal surface 50a of the substrate 50. The buffer layer 52 is made of a III-V group compound semiconductor, such as GaSb. The thickness of the buffer layer 52 is, for example, 1.0 μm. The substrate 50 and the buffer layer 52 constitute a III-V group compound semiconductor region in the present embodiment.

Next, the n-type contact layer 14, the optical absorption layer 16, and the p-type contact layer 18 are epitaxially grown in this order on the buffer layer 52 to form a substrate product 4. In this step, the n-type contact layer 14, the optical absorption layer 16, and the p-type contact layer 18 are grown using, for example, a growth method such as a molecular beam epitaxy (MBE) method. After this, a temporary substrate 54 is bonded to the p-type contact layer 18. The temporary substrate 54 may be made of any material as long as the mechanical strength of the substrate product 4 can be maintained. For example, the temporary substrate 54 is a silicon substrate. In this step, the temporary substrate 54 is bonded to the p-type contact layer 18 by using a wafer bonding method, for example.

Figure 7B:
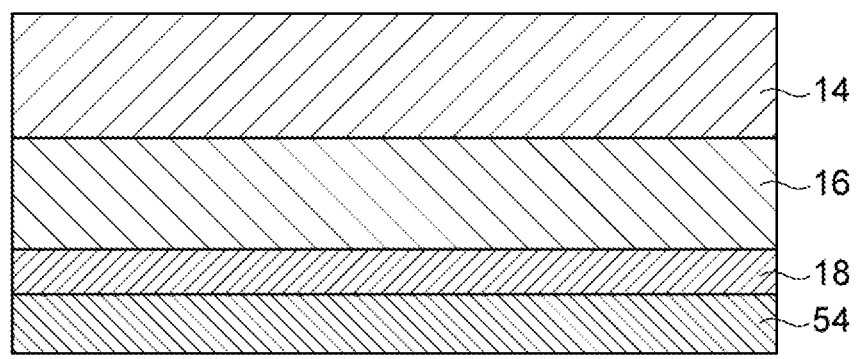

Subsequently, the III-V group compound semiconductor region (the substrate 50 and the buffer layer 52) is removed to expose the n-type contact layer 14, as shown in FIG. 7B. For the removal of the III-V group compound semiconductor region, various methods such as mechanical polishing (lapping), chemical polishing, and chemical mechanical polishing are used. For example, mechanical polishing is performed, and the polished surface is then etched by using a wet etching method. As a wet etching solution, a solution containing water, phosphoric acid, citric acid, and hydrogen peroxide is used.

Figure 8A:
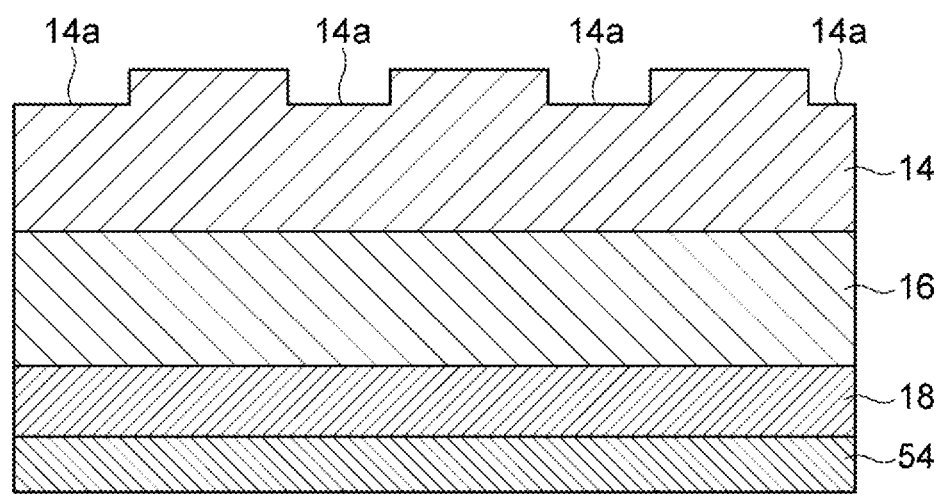
FIGS. 8A and 8B show steps in the production method of the embodiment.

Subsequently, as shown in FIG. 8A, regions of the n-type contact layer 14 where the cathode electrodes 22 are to be formed are etched to form a plurality of recesses 14a in the n-type contact layer 14. The depth of each of the recesses 14a is the same as the contact length between the cathode electrode 22 and the n-type contact layer 14 in the thickness direction (Z direction) and is, for example, 0.1 μm or more and 0.2 nm or less. For the etching, for example, a dry etching method or a wet etching method is used.

Figure 8B:
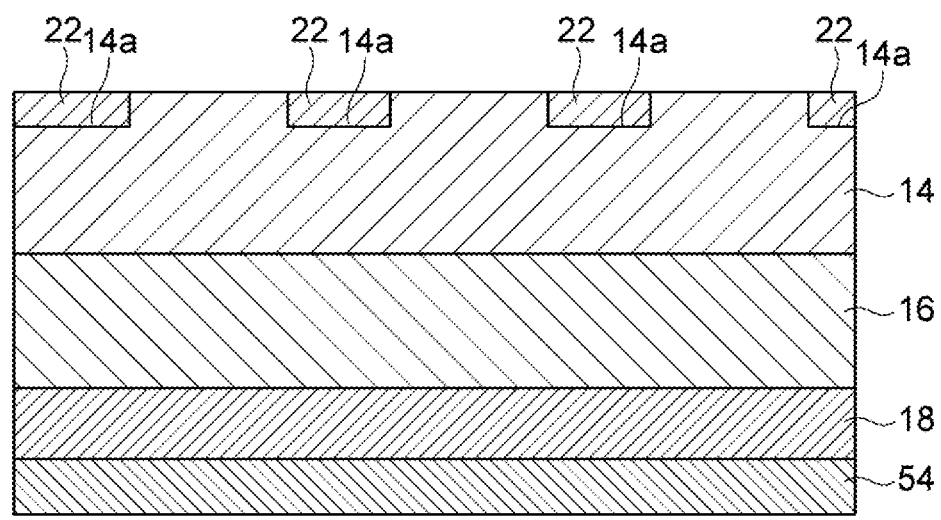

Subsequently, as shown in FIG. 8B, the cathode electrodes 22 in contact with the n-type contact layer 14 are each formed in the plurality of recesses 14a. The formation of the cathode electrodes 22 is carried out, for example, using what is called a lift-off method as described below. Specifically, a resist is first formed on the surface of the n-type contact layer 14, and the resist on the plurality of recesses 14a is removed to form openings. Next, a metal to form the cathode electrodes 22 is deposited. As a result, a metal film is formed in the plurality of recesses 14a and on the resist. After this, the resist is removed together with the metal film on the resist. In this manner, the cathode electrodes 22 are formed in the plurality of recesses 14a.

Figure 9A:
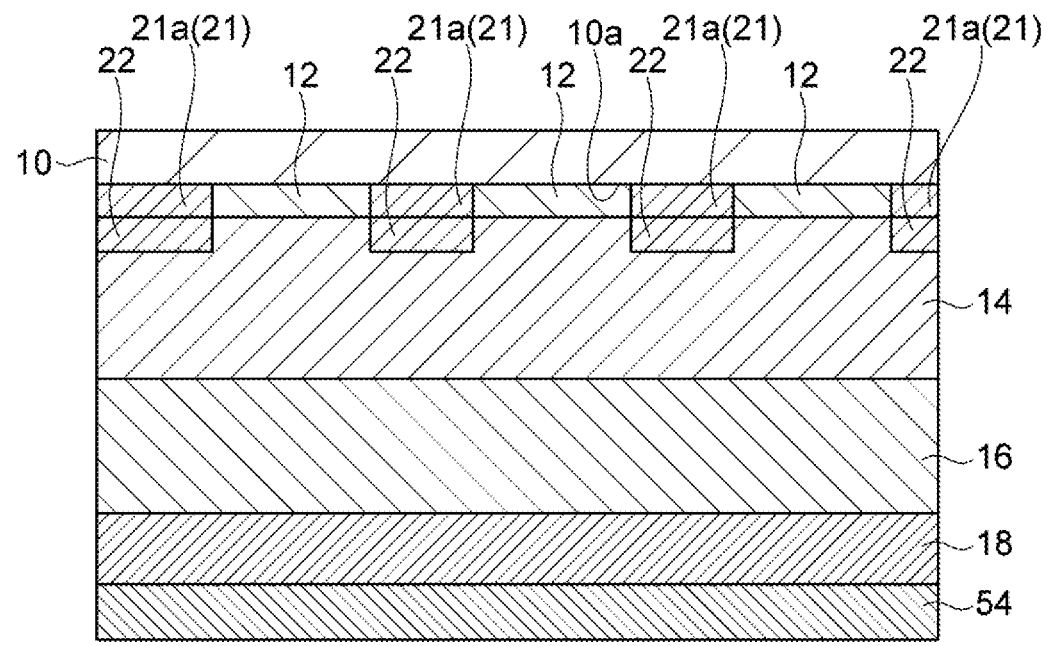
FIGS. 9A and 9B show steps in the production method of the embodiment.

Subsequently, as shown in FIG. 9A, the substrate 10 is fixed to the n-type contact layer 14 and the plurality of cathode electrodes 22. The substrate 10 has the above-described metal wire 21 on the principal surface 10a. In this step, the substrate 10 is fixed to the n-type contact layer 14 and the plurality of cathode electrodes 22 such that the principal surface 10a on which the metal wire 21 is formed faces the n-type contact layer 14 and the plurality of cathode electrodes 22. Specifically, the plurality of bonding portions 21a of the metal wire 21 on the substrate 10 is each conductively bonded to each of the plurality of cathode electrodes 22 by flip-chip bonding. Conductive bonding members such as indium bumps may be interposed between the plurality of cathode electrodes 22 and the plurality of bonding portions 21a. The filler 12 is injected into the gap between the n-type contact layer 14 and a region on the principal surface 10a of the substrate 10 where the metal wire 21 is not disposed, and the filler 12 is cured. As a result of being cured, the filler 12 bonds the substrate 10 and the n-type contact layer 14 to each other.

Figure 9B:
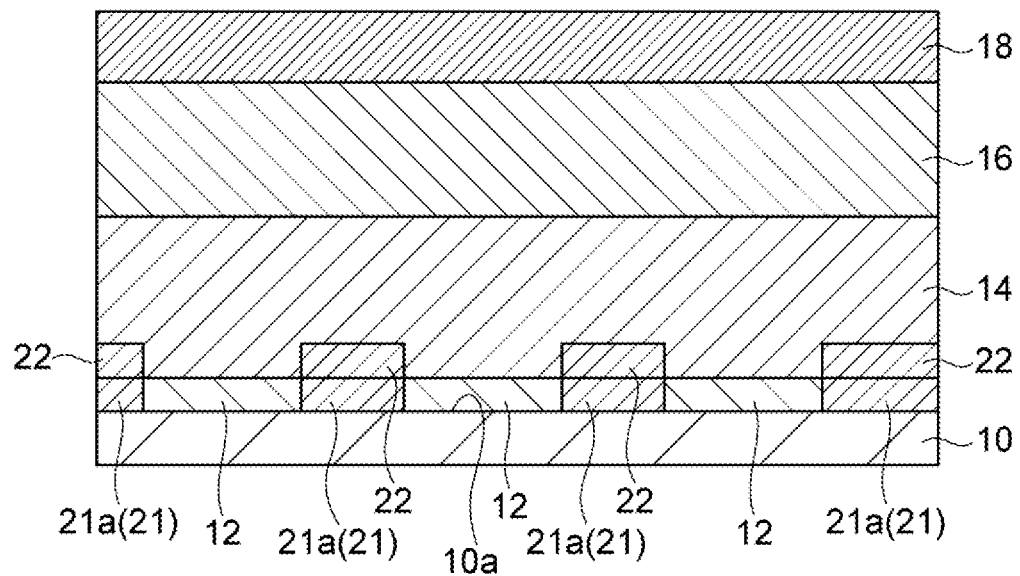
Figure 10A:
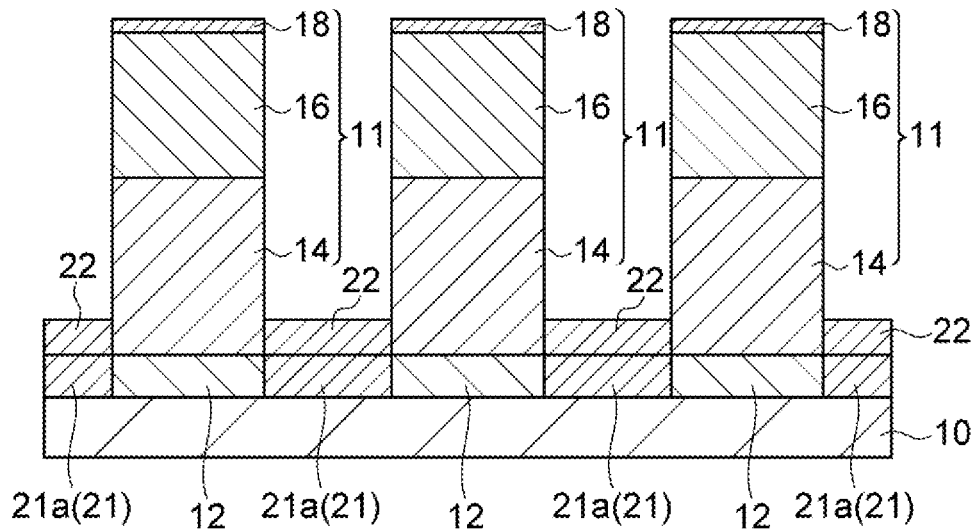
FIGS. 10A and 10B show steps in the production method of the embodiment.

Subsequently, as shown in FIG. 9B, the temporary substrate 54 is removed from the p-type contact layer 18. For the removal of the temporary substrate 54, various methods such as mechanical polishing (lapping), chemical polishing, and chemical mechanical polishing are used. After this, as shown in FIG. 10A, the plurality of semiconductor mesas each of which includes a stacked semiconductor layer 11 and separated from one another is formed by etching the p-type contact layer 18, the optical absorption layer 16, and the n-type contact layer 14. The semiconductor mesas are separated from one another by a groove disposed between the semiconductor mesas. The stacked semiconductor layer 11 includes the p-type contact layer 18, the optical absorption layer 16, and the n-type contact layer 14. Specifically, an etching mask that only covers regions to be the semiconductor mesas is formed on the p-type contact layer 18 that has been exposed as a result of the removal of the temporary substrate 54. The p-type contact layer 18, the optical absorption layer 16, and the n-type contact layer 14 are etched using the etching mask by using a dry etching method or a wet etching method. The etching is performed until the cathode electrodes 22 are exposed. Consequently, the semiconductor mesas including the stacked semiconductor layers 11 are completely separated from one another.

Figure 10B:
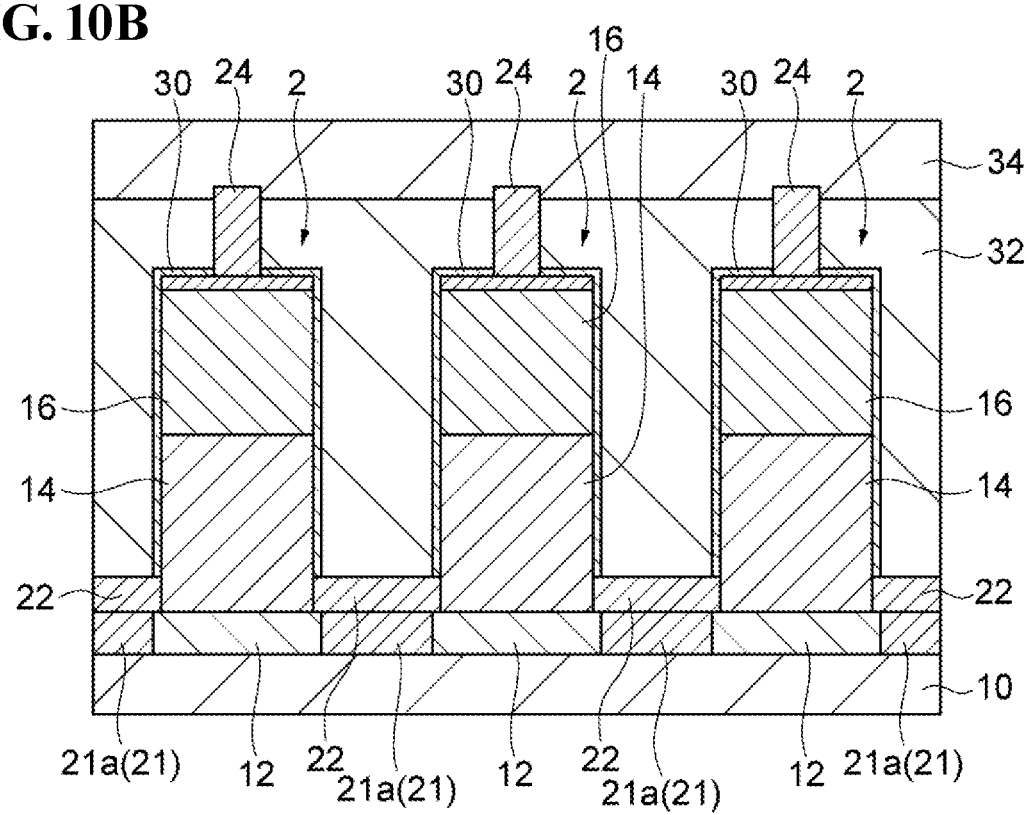

Subsequently, as shown in FIG. 10B, the passivation films 30 are formed on the surface of the plurality of semiconductor mesas including the stacked semiconductor layers 11. When the passivation films 30 are silicon-based inorganic insulating films (e.g., $SiO_2$), plasma vapor deposition is used, for example, as a film-forming method. After this, openings are formed in the passivation films 30 on the p-type contact layer 18, and the anode electrodes 24 in contact with the p-type contact layers 18 are formed in the openings. Simultaneously, the wire 20 and the electrode 26 shown in FIG. 1 are formed. The anode electrodes 24, the wire 20, and the electrode 26 are formed, for example, by the same method (the lift-off method) as that used for the cathode electrodes 22 described above. After this, the plurality of anode electrodes 24 and the electrode 26 are conductively bonded to a plurality of electrodes of the silicon integrated device 34. Specifically, each of the plurality of electrodes of the silicon integrated device 34 is conductively bonded to each of the plurality of anode electrodes 24 and to the electrode 26 by flip-chip bonding. Conductive bonding members such as indium bumps may be interposed between the plurality of anode electrodes 24 and the plurality of electrodes of the silicon integrated device 34 and between the electrode 26 and the electrode of the silicon integrated device 34. After this, the gap between the plurality of semiconductor mesas including the stacked semiconductor layers 11 and the gap between the plurality of anode electrodes 24 are filled with the underfill 32, and the underfill 32 is cured. Through this process, the light receiving device 2A of the present embodiment is completed.

Benefits provided by the light receiving device 2A of the present embodiment and the method for production thereof described above will be described. In the light receiving device 2A, the plurality of stacked semiconductor layers 11 included in the semiconductor mesas is separated from one another, and each of the stacked semiconductor layers 11 includes the n-type contact layer 14. The n-type contact layer 14 is a lower contact layer in contact with the cathode electrode 22 and has a type-II superlattice structure including an n-type III-V group compound semiconductor. In the light receiving device 2A, no electrode common to the plurality of photodiodes 2 is disposed, but each of the photodiodes 2 includes the cathode electrode 22. Accordingly, it is not required to stop the etching of the stacked semiconductor layers 11 for forming the semiconductor mesas (see FIG. 10A) at the n-type contact layer 14. Therefore, the n-type contact layer 14, which is a lower contact layer having a superlattice structure, may have a small thickness, and thus the dark current of the photodiodes 2 may be reduced to achieve increased photodetection accuracy. In addition, the rapid transfer of carriers is not impeded, and thus sufficient photosensitivity can be achieved even if the bias voltage applied between the cathode electrode 22 and the anode electrode 24 is low.

Figure 11:
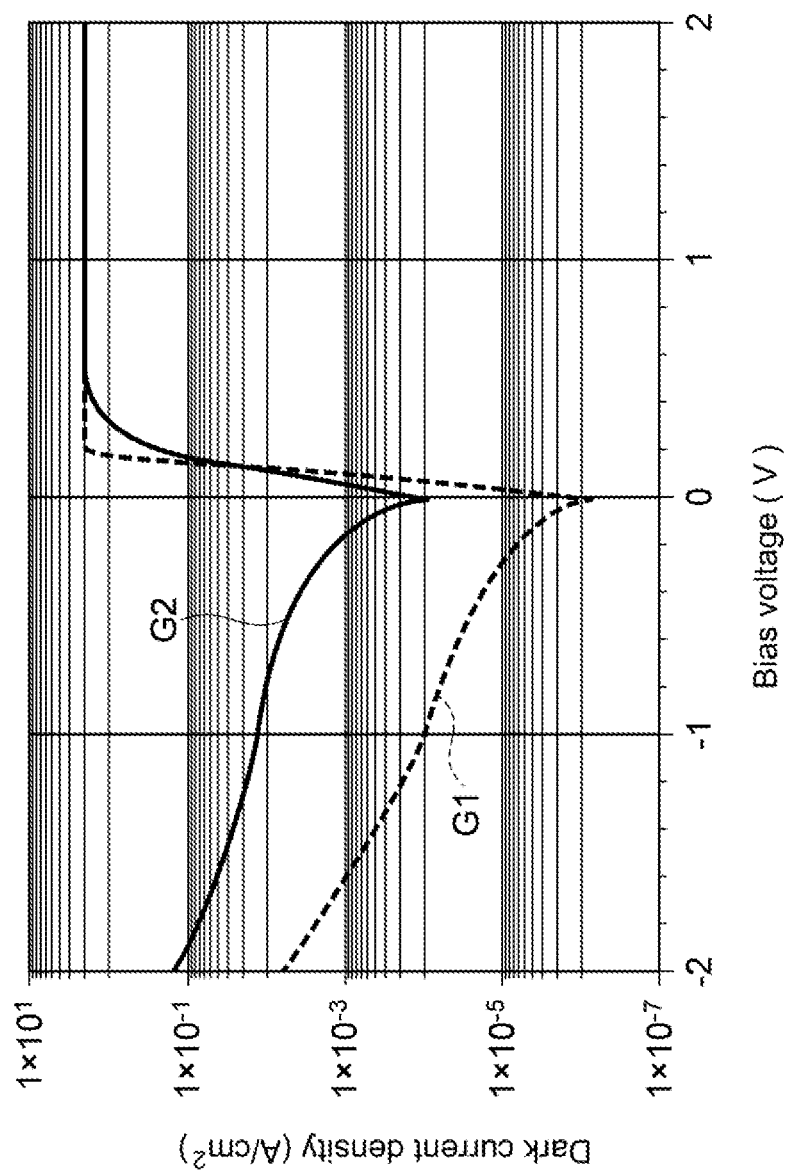
FIG. 11 is a graph showing exemplary relationships between bias voltages and dark current densities of light receiving devices.

FIG. 11 is a graph showing exemplary relationships between bias voltages and dark current densities of light receiving devices. The horizontal axis represents the magnitude of bias voltage applied between a cathode electrode and an anode electrode. The vertical axis represents the magnitude of dark current density generated in the light receiving devices. Graph G1 shows the characteristics of the present embodiment, and Graph G2 shows the characteristics of a conventional light receiving device (that includes an electrode common to a plurality of photodiodes and an n-type contact layer having a thickness of 3 μm). As shown in FIG. 11, the dark current density of the light receiving device 2A of the present embodiment is much lower than that of the conventional light receiving device (Graph G2). Thus, according to the light receiving device 2A of the present embodiment, the dark current of the photodiodes 2 can be effectively reduced.

As in the present embodiment, the light receiving device 2A may include the substrate 10 that is connected to the plurality of cathode electrodes 22 and transmits the infrared light L. This enables the plurality of photodiodes 2 to be supported without blocking the entry of the infrared light L into the stacked semiconductor layer 11. Thus, the reliability of the light receiving device 2A may be enhanced.

As in the present embodiment, the gap between the substrate 10 and the n-type contact layer 14 may be filled with the infrared transmissive filler 12. With this configuration, the reflection of the infrared light L on the back surface of the n-type contact layer 14 may be reduced. In addition, the plurality of photodiodes 2 may be more firmly supported. Consequently, the reliability of the light receiving device 2A may be more enhanced.

As in the present embodiment, the cathode electrode 22 may be in contact with a side surface of the n-type contact layer 14 in the semiconductor mesa. This configuration allows at least part of the back surface of the n-type contact layer 14, that is, at least part of the plane of light incidence of the stacked semiconductor layer 11 to be uncovered by the cathode electrode 22. Thus, contact between the cathode electrode 22 and the n-type contact layer 14 may be achieved without blocking the entry of the infrared light L into the stacked semiconductor layer 11. In this case, the contact length between the cathode electrode 22 and the n-type contact layer 14 in the stacking direction of the stacked semiconductor layer 11 may be 0.1 µm or more and 0.2 nm or less. With this configuration, sufficient contact between the cathode electrode 22 and the n-type contact layer 14 may be provided.

As in the present embodiment, the thickness of the n-type contact layer 14 may be 300 nm or more and 500 nm or less. According to the light receiving device 2A of the present embodiment, such a thin n-type contact layer 14 may be achieved.

As in the present embodiment, the superlattice structure of the n-type contact layer 14 may include a first layer containing As and a second layer containing Sb. In this case, the second layer of the superlattice structure of the n-type contact layer 14 may be made of a semiconductor material different from that of the first layer.

Modified Embodiment

Figure 12:
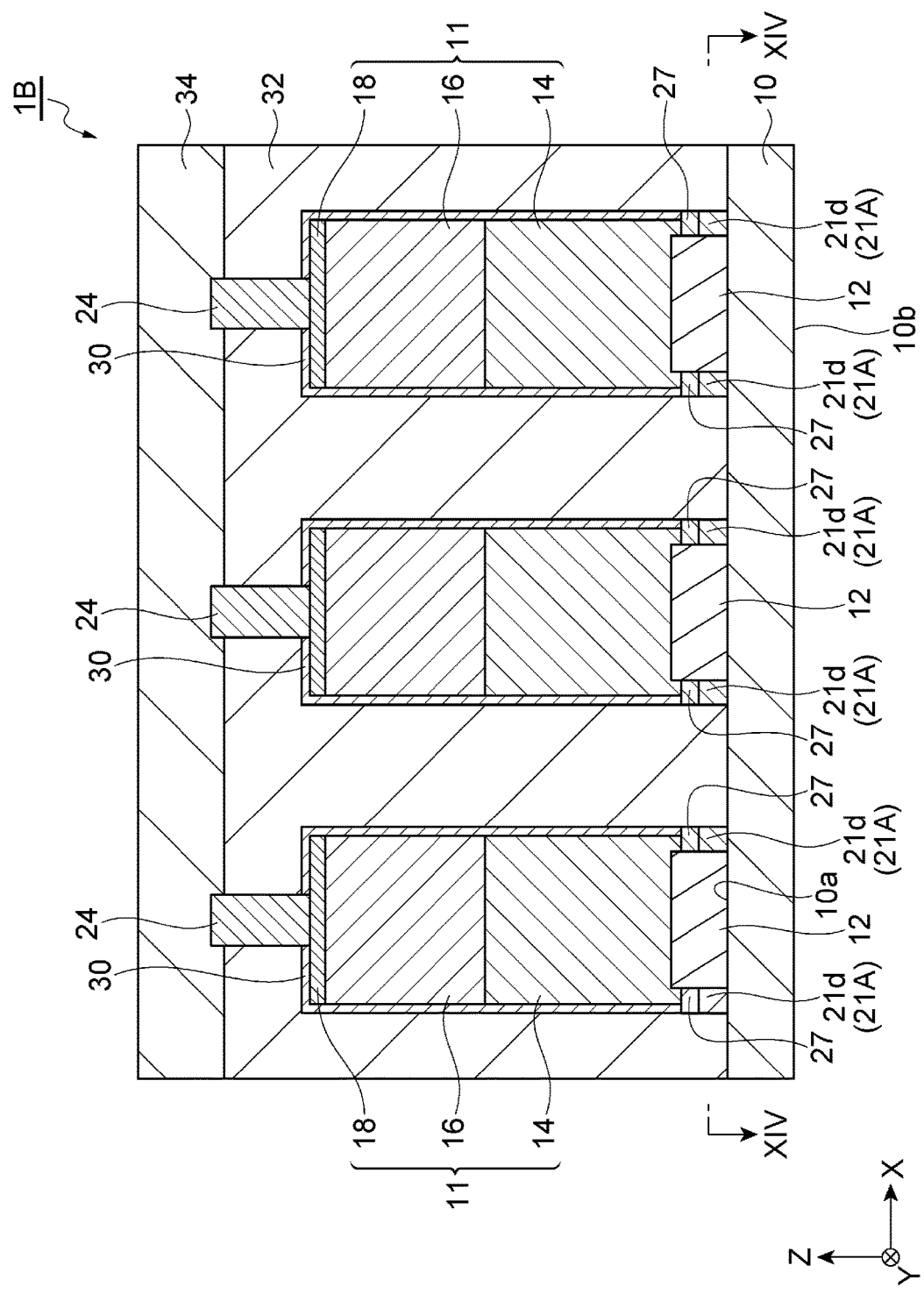
FIG. 12 is an enlarged sectional view showing a configuration of an infrared light receiving apparatus according to a modified embodiment.

FIG. 12 is an enlarged sectional view showing a configuration of an infrared light receiving apparatus 1B according to a modification of the above embodiment. As shown in FIG. 12, the infrared light receiving apparatus 1B includes a plurality of cathode electrodes 27 in place of the plurality of cathode electrodes 22 in the above embodiment. The plurality of cathode electrodes 27 is each disposed immediately below the n-type contact layers 14 of the plurality of photodiodes 2. Each of the cathode electrodes 27 is in contact with part of a surface (i.e., the back surface) of each of the n-type contact layers 14 opposite to the optical absorption layer 16. Specifically, the planar shape (the shape viewed from the Z direction) of the cathode electrode 27 is a frame-like planar shape (quadrangle) or a doughnut-like planar shape. The cathode electrode 27 is disposed on an outer peripheral part of the back surface of the n-type contact layer 14. The cathode electrode 27 has an opening 27a inside the frame, and the back surface of the n-type contact layer 14 is exposed through the opening 27a. The infrared light L that has entered from the back surface side of the infrared light receiving apparatus 1B passes through the opening 27a and enters the stacked semiconductor layer 11. The cathode electrode 27 is made of the same material as that of the cathode electrode 22 in the above embodiment. In producing the infrared light receiving apparatus 1B, the cathode electrode 27 is formed on the back surface of the n-type contact layer 14 without forming the recesses 14a (see FIG. 8A).

Figure 13:
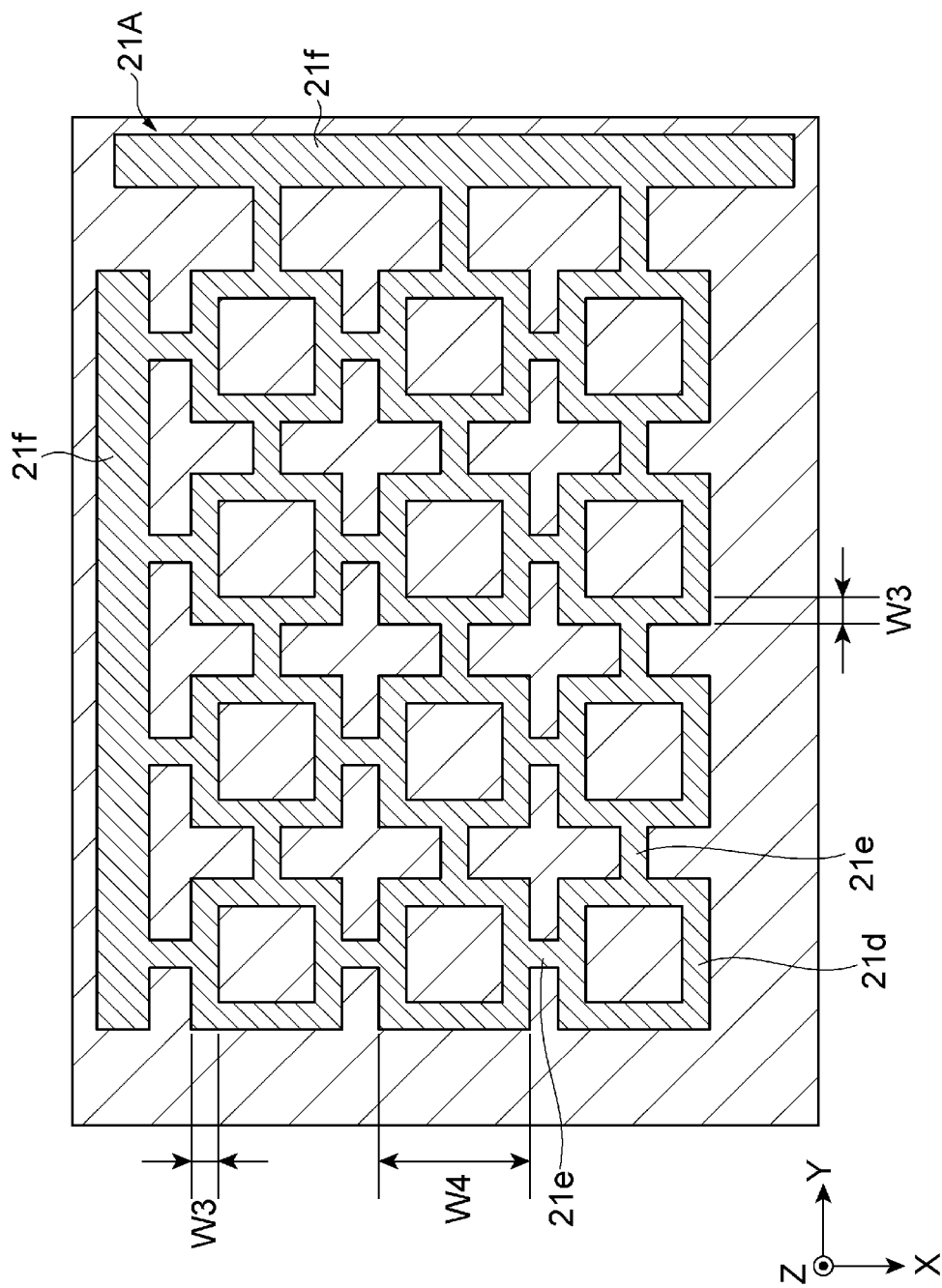
FIG. 13 is a sectional view taken along line XIV-XIV of FIG. 12 and shows the planar shape of a metal wire.

In the infrared light receiving apparatus 1B, a metal wire 21A is disposed on the principal surface 10a of the substrate 10 in place of the metal wire 21 in the above embodiment. FIG. 13 is a sectional view taken along line XIV-XIV of FIG. 12 and shows the planar shape of the metal wire 21A. As shown in FIG. 13, the metal wire 21A is constituted by a plurality of bonding portions 21d, a plurality of wiring portions 21e, and first and second wiring portions 21f. The plurality of bonding portions 21d is two-dimensionally aligned along the second axis direction and the third axis direction and each disposed immediately below the plurality of cathode electrodes 27. The bonding portions 21d each have an opening. In this embodiment, the wiring portions 21e are disposed between the bonding portions 21d not across the openings. Through the openings of the bonding portions 21d, light from the back surface 10b (light receiving surface) side of the substrate 10 enters the n-type contact layer 14 of each of the photodiodes 2. Each of the bonding portions 21d is conductively bonded to the cathode electrode 27 of each of the photodiodes 2, for example, by flip-chip bonding. The bonding portion 21d has the same planar shape (e.g., a frame-like planar shape or a doughnut-like planar shape) as that of the cathode electrode 27. A width W3 of a frame line of the bonding portion 21d (i.e., a width of a frame line of the cathode electrode 27) is, for example, 2 µm. A width W4 of a side of the bonding portion 21d (i.e., a width of a side of the cathode electrode 27) is, for example, 13 µm to 24 µm. The wiring portions 21e are disposed between the bonding portions 21d aligned in the second axis direction and between the bonding portions 21d aligned in the third axis direction and connect the adjacent bonding portions 21d to each other.

The first wiring portion 21f is disposed at one end in the second axis direction on the principal surface 10a of the substrate 10 and extends in the third axis direction. The first wiring portion 21f connects together lines of the bonding portions 21d along the second axis direction. The second wiring portion 21f is disposed on one end in the third axis direction of the principal surface 10a of the substrate 10 and extends in the second axis direction. The second wiring portion 21f connects together rows of the bonding portions 21d along the third axis direction. These wiring portions 21f are each electrically connected via the wire 20 to the electrode 26. The wire 20 is disposed along a side surface of the semiconductor mesa disposed on an end of the substrate (see FIG. 1). The electrode 26 is disposed on a top surface of the semiconductor mesa disposed on the end of the substrate (see FIG. 1).

Regions inside the bonding portions 21d on the principal surface 10a of the substrate 10 are filled with the infrared transmissive filler 12. Therefore, as shown in FIG. 12, the gap between the substrate 10 and the n-type contact layer 14 of the stacked semiconductor layer 11 is filled with the filler 12. Also in the embodiment, the filler 12 is made of, for example, a resin (underfill), a silicon-based inorganic insulating film such as a silicon oxide film, a silicon nitride film, and a silicon oxynitride film, or an antireflection coating film. The filler 12 does not need to be disposed, and the gap between the substrate 10 and the n-type contact layer 14 may be a void (air gap). A region outside the bonding portion 21d on the principal surface 10a of the substrate 10 is filled with the underfill 32.

According to the infrared light receiving apparatus 1B, the n-type contact layer 14 has a small thickness similarly to the infrared light receiving apparatus 1A of the above embodiment. Consequently, the dark current of the photodiodes 2 may be reduced to achieve increased photodetection accuracy. In addition, the rapid transfer of carriers is not impeded, and thus sufficient photosensitivity can be achieved even if the bias voltage applied between the cathode electrode 27 and the anode electrode 24 is low.

As in the embodiment, the cathode electrode 27 may be in contact with part of a surface of the n-type contact layer 14 opposite to the optical absorption layer 16. With this configuration, the infrared light L may enter through the rest of the surface (i.e., the plane of light incidence). Therefore, the entry of the infrared light L into the stacked semiconductor layer 11 may be ensured. In this case, the frame-like planar shape of the cathode electrode 27 provides sufficient contact between the cathode electrode 27 and the n-type contact layer 14 while ensuring the entry of the infrared light L into the stacked semiconductor layer 11.

The light receiving device and the method for producing a light receiving device according to the present invention are not limited to the above-described embodiments, and various modifications may be made. For example, in the embodiments, the case where the first conductivity-type is n-type and the second conductivity-type is p-type has been described. However, the first conductivity-type may be p-type, and the second conductivity-type may be n-type. In the embodiment, the case where the first electrode is in contact with both of the n-type contact layers of adjacent stacked semiconductor layers has been described, but the first electrode may be in contact only with the n-type contact layer of one stacked semiconductor layer. In the modified embodiment, the case where the planar shape of the first electrode is frame-like has been described, but the first electrode may have various other shapes as long as the first electrode is in contact with part of the back surface of the n-type contact layer.

While principles of the present invention have been described with reference to preferred embodiments and drawings, it will be appreciated by those skilled in the art that the present invention can be changed in arrangement and in details without departing from the principles. The present invention is not limited to the specific configurations disclosed in the embodiments. Therefore, the claims and all the modifications and changes within the spirit of the claims are claimed as the invention.

What is claimed is:

1. A light receiving device comprising:
a substrate having a principal surface and a back surface opposite to the principal surface, the back surface including a light receiving surface;
a metal wire disposed on the principal surface of the substrate, the metal wire including a bonding portion having an opening; and
a plurality of photodiodes that is arranged in an array on the substrate, each of the photodiodes including an electrode connected to the bonding portion of the metal wire and a semiconductor mesa including a stacked semiconductor layer, the stacked semiconductor layer including a first semiconductor layer disposed on the substrate, an optical absorption layer disposed on the first semiconductor layer, and a second semiconductor layer disposed on the optical absorption layer, the first semiconductor layer including a first conductivity-type III-V group compound semiconductor, the optical absorption layer including a type-II superlattice structure, the second semiconductor layer including a second conductivity-type III-V group compound semiconductor, wherein each of the electrodes of the photodiodes is disposed on a surface of the first semiconductor layer that faces to the light receiving surface of the substrate through the opening of the bonding portion, the electrode is in contact with the first semiconductor layer at the surface of the first semiconductor layer, the electrode has an opening, and the surface of the first semiconductor layer is exposed through the opening of the electrode.

2. The light receiving device according to claim 1, further comprising a filler provided in the opening of the bonding portion.

3. The light receiving device according to claim 1, wherein the electrodes of the photodiodes is disposed on an outer peripheral part of the surface of the first semiconductor layer, and the electrodes of the photodiodes have a frame-like planar shape or a doughnut-like planar shape.

* * * * *